(12) United States Patent
Loeffler et al.

(10) Patent No.: US 7,548,471 B2
(45) Date of Patent: Jun. 16, 2009

(54) METHOD AND APPARATUS FOR ADJUSTING THE TIMING OF AN ELECTRONIC CIRCUIT

(75) Inventors: Steffen Loeffler, Essex Jct., VT (US); Jochen Hoffmann, Colchester, VT (US)

(73) Assignee: Qimonda North America Corp., Cary, NC (US)

( * ) Notice: Subject to any disclaimer, the term of this patent is extended or adjusted under 35 U.S.C. 154(b) by 95 days.

(21) Appl. No.: 11/859,273

(22) Filed: Sep. 21, 2007

(65) Prior Publication Data
US 2009/0080582 A1   Mar. 26, 2009

(51) Int. Cl.
*G11C 7/00* (2006.01)
(52) U.S. Cl. ............... 365/194; 365/189.08; 365/233.1; 365/233.11
(58) Field of Classification Search ................ 365/194, 365/189.08, 233.1, 233.11
See application file for complete search history.

(56) References Cited

U.S. PATENT DOCUMENTS

| | | | |
|---|---|---|---|
| 6,417,715 B2 * | 7/2002 | Hamamoto et al. | 327/291 |
| 6,721,232 B2 * | 4/2004 | Kashiwazaki | 365/189.15 |
| 6,741,109 B1 * | 5/2004 | Huang et al. | 327/156 |
| 7,149,131 B2 * | 12/2006 | Choi et al. | 365/189.09 |
| 7,170,819 B2 * | 1/2007 | Szczypinski | 365/189.05 |
| 7,263,009 B2 * | 8/2007 | Arai | 365/194 |

* cited by examiner

*Primary Examiner*—Hein N. Nguyen
(74) *Attorney, Agent, or Firm*—Patterson & Sheridan, L.L.P.

(57) ABSTRACT

Methods and circuits for detecting variations in signal propagation rates within an electronic device, and for adjusting the output timing of the device in response to the variations in signal propagation rates. According to an embodiment of the invention, a signal may be propagated through an uncompensated delay chain and a compensated delay chain. If the signal passes through the compensated chain slower than through the uncompensated delay chain, then the device may delay a clock signal such that the output timing of the device will remain within the specification parameters. In contrast, if the signal passes through the uncompensated delay chain slower than through the compensated delay chain, the device may not delay the received clock signal such that the output timing of the device will remain within specification parameters.

25 Claims, 10 Drawing Sheets

METHOD AND APPARATUS FOR ADJUSTING THE TIMING OF AN ELECTRONIC CIRCUIT

BACKGROUND OF THE INVENTION

Many electronic devices typically operate according to specific requirements with regards to data output timing. For example, two timing parameters may be data access time and data hold time. Data access time is typically the maximum time from an external event (e.g., starting from an output of data from the device) until the data on the output of the device is valid. Data hold time is typically the minimum time data stays valid on data lines of a device after a new command to the device has been issued. These parameters are related to one another since they may be triggered by the same external event (e.g., they may be triggered by a read command received from an external device). Depending on the architecture, the brand, or the type of electronic device, the specific requirements for these timing parameters may be different.

To allow for maximum data-access rates, if several bits of data have to be output sequentially, each bit of data is usually driven until it is replaced by the next bit of data (i.e., with no invalid period between the data). If this is the case, data hold time may be equal to the minimum allowed access time (i.e., the hold time for the last bit of data) while the data access time may become the maximum allowed access time. Thus, devices may have a specification requirement for a minimum data hold time and a maximum data access time. Therefore, for proper operation with respect to the specification of the device, data output timing typically needs to fit within a window between data hold time and data access time. This window may be known as a data output timing window.

Factors such as manufacturing process variations, operating temperature variations and supply voltage variations may cause the propagation rate of signals passing through the device to change. Consequently, changes in the manufacturing process or changes in environmental variables may affect the data output timing such that the device no longer outputs data within the specified data output timing window (or "data eye").

In response to data output timing requirements, some timing adjustment techniques have been devised. One solution to this problem has been to simulate an adjusted timing of the device in the design phase to meet the specification requirements. However, if the timing requirements are very narrow this solution may not be sufficient to compensate for variations in manufacturing yield or changes in environmental variables. Furthermore, the solution of adjustment of the timing during the design phase may be ineffective in devices that do not use voltage regulation. Voltage regulation may provide a constant voltage to an electronic device in response to changes in supply voltage and/or changes to temperature.

Other solutions are equally unsatisfactory. For example, some techniques may work well for device manufacturing process variations, but not for device voltage and temperature variations. Other solutions may use a free running clock, which increases power consumption of the device. In some cases, timing adjustment techniques may not be used for devices that operate in mixed modes (e.g., NOR-flash interface), asynchronously or that allow clock-suspended operation.

SUMMARY OF THE INVENTION

Embodiments of the invention generally provide methods and apparatus for adjusting timing of electronic devices. The method generally includes receiving a trigger signal and, based on the trigger signal, determining whether the electronic device is operating in one of a first mode and a second mode; the modes being indicative of relative signal propagation rates. If the memory device is operating in the first mode, an output of data is triggered with a first clock signal. If the memory device is operating in the second mode, the output data is triggered with a second clock signal, wherein the second clock signal is delayed relative to the first clock signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
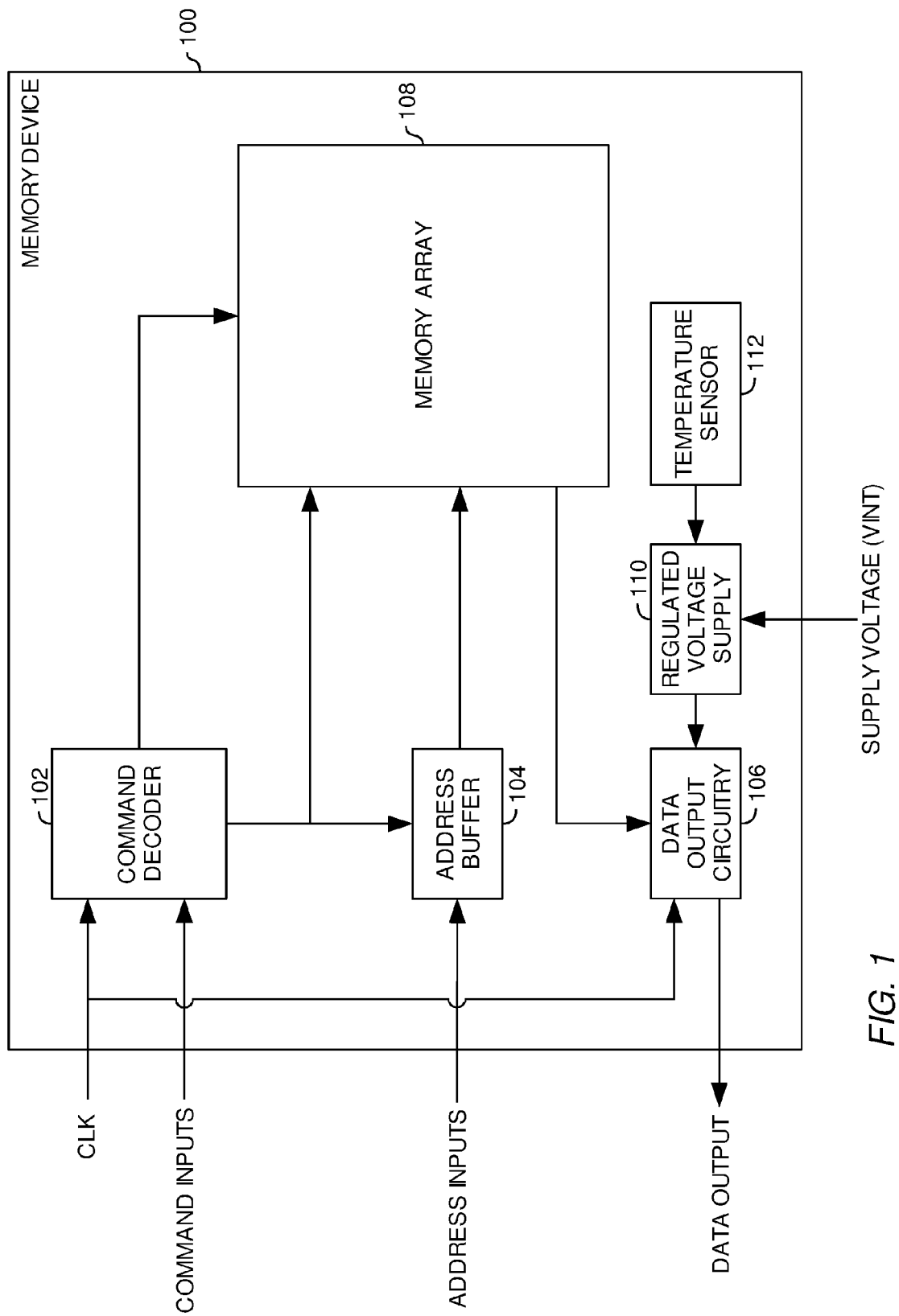
FIG. 1 is a block diagram depicting a memory device, according to one embodiment of the invention.

Embodiments of the invention generally provide circuits for detecting variations in signal propagation rates within an electronic device, and circuits for adjusting the output timing of the device in response to the variations in signal propagation rates. According to an embodiment of the invention, a signal may be propagated through an uncompensated delay chain and a compensated delay chain. If the signal passes through the compensated chain slower than through the uncompensated delay chain, then the device may be operating in a fast condition. In the fast condition, signals may propagate through the device faster than expected (i.e., faster than provided for according to device specifications), and consequently the device may operate outside of timing specifications (e.g., output data not held long enough on data output pins to satisfy specifications). According to embodiments of the invention, in the fast condition, the circuit may delay a clock signal such that the output timing of the device will remain within the specification parameters.

In contrast, if the signal passes through the uncompensated delay chain slower than through the compensated delay chain, the device may be operating in a slow condition (i.e., timing signals may propagate through the device more slowly than in the fast condition). According to embodiments of the invention, in slow condition, the circuit may not delay the received clock signal such that the output timing of the device will remain within specification parameters. Therefore, embodiments of the present invention provide techniques and devices for detecting signal propagation rates within devices, and adjusting data output timing in response to the signal propagation rates.

While described below with respect to clock signals and data within in a memory device, embodiments of the invention may be used in any device in which variables (e.g., development process variations, voltage variations, temperature variations, etc.) may alter the data output timing of the device and in which timing may need to be adjusted.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

FIG. 1 is a block diagram depicting a memory device 100, according to one embodiment of the invention. The memory device 100 may include address inputs and command inputs. The address inputs may be received by an address buffer 104, and the command inputs may be received by a command decoder 102. The command inputs and the address inputs may be used to access memory cells (containing data) within a memory array 108. Circuitry such as a wordline decoder, column decoder, sense amps, output buffers, data strobe circuits, may also be used to access and output data from the memory array 108.

According to one embodiment of the invention, the memory device 100 has a clock input (CLK). The clock input may receive a clock signal in order to synchronize the output of the memory device 100 with an external device. The clock signal may be used to synchronize the timing of data output by the memory device 100 with the reading in of data by the external device. The memory device 100 may also contain data output circuitry 106, according to one embodiment of the invention. The data output circuitry 106 may be used to latch data onto the output terminals of the memory device 100. Furthermore, the data output circuitry 106 may adjust the data output timing of the memory device 100 so that the memory device 100 outputs data according to the specification parameters. Therefore, the external device may receive data at an expected time (according to specification parameters) with respect to the clock signal (CLK).

The memory device 100 may be provided with an external supply voltage (VINT) in order to power the internal circuitry of the memory device 100. Many components within the device may use the external supply voltage including, but not limited to, a regulated voltage supply 110. As explained in further detail with reference to FIG. 3, the regulated voltage supply 110 may use the external supply voltage to provide a regulated voltage to the data output circuitry 106. The regulated voltage (VDEL) may vary in level (potential) in response to changes in the external supply voltage. Furthermore, the regulated voltage may vary in level in response to changes in temperature. Thus, in one embodiment, the regulated voltage supply 110 may detect the temperature of the memory device 100 and provide a regulated voltage, for example, by receiving a temperature signal from a temperature sensor 112 (e.g., a sensor on the memory device).

Figure 2:
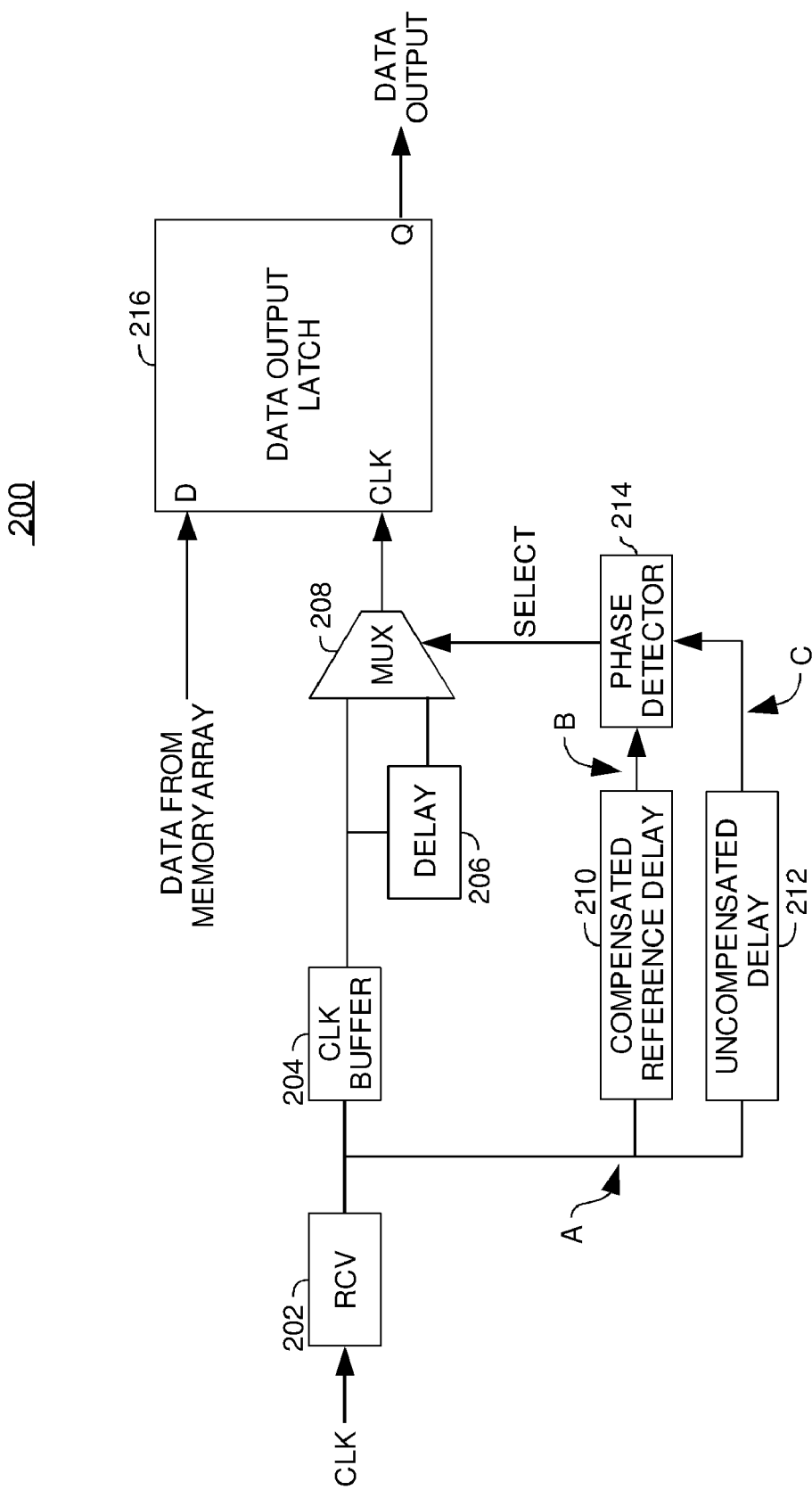
FIGS. 2, 7, 8 and 9 are block diagrams of exemplary circuits for adjusting the output timing of a memory device, according to embodiments of the invention.

FIG. 2 is a block diagram of a circuit 200 illustrating one embodiment of the internal components of the data output circuitry 106. A clock signal (CLK) enters the exemplary circuit and is routed into the receiver 202. Within the receiver 202 the clock signal may be amplified to a predefined level such that the signal may have sufficient strength or intensity to propagate through the output timing adjustment circuit 200.

The output of the receiver 202 may be connected in such a manner so as to route the amplified clock signal to the inputs of a clock buffer 204, a compensated reference delay 210, and an uncompensated delay 212. In one embodiment, when the clock signal enters the clock buffer 204, a delay is inserted (a buffer delay) such that the clock signal is delayed a predefined number, or portion of, clock periods (e.g., one period). According to one embodiment of the invention, the output of the clock buffer 204 may be connected to the input of a delay device 206 and to a first input of a multiplexer 208. The delay device 206 may delay the clock signal a predefined amount of time.

As described above, in a fast condition, a memory device may be operating under conditions which may cause signals propagating through the memory device 100 to travel at a higher rate of speed than signals propagating through the memory device under normal operating conditions. The delay device 206 may allow the memory device 100, when operating in a fast condition, to output data within the timeframe (window) required by the device specifications. The delay device 206 may be constructed of components and in a manner known by those skilled in the art. For example, the delay device 206 may be a series of inverters. The output of the delay device 206 may be connected to a second input of the multiplexer 208.

As noted previously, the clock signal output by the receiver 204 may also be routed to a compensated reference delay 210 and to an uncompensated reference delay 212. The compensated reference delay 210 may be supplied with the regulated voltage provided by the regulated voltage supply shown in FIG. 1. Through the use of the regulated voltage, the compensated reference delay 210 may provide a circuit through which a signal will propagate at a known rate and time. The regulated voltage supplied to the compensated reference delay 210 may vary corresponding to changes in temperature and external supply voltage. Embodiments for regulating the voltage for a compensated reference delay with respect to changes in temperature and supply voltage are discussed further below with reference to FIGS. 3A-3E.

In contrast, an uncompensated delay 212 may not be supplied with a regulated voltage. In one embodiment, the uncompensated delay 212 is supplied via an external voltage supply. The external voltage supply level may vary in level corresponding to changes in battery power, loading, etc. Furthermore, the external voltage supply may not compensate voltage level with respect to temperature changes in memory device 100. Therefore, a signal propagating through the uncompensated delay may experience changes in propagation rate due to varied external supply voltage levels and changes in memory device temperature 100. Thus, the signal propagating through the uncompensated delay 212 may propagate more slowly when the memory device 100 is operating in a slow condition and more quickly when the device is operating in a fast condition. In contrast, the signal propagating through the compensated reference delay 210 may propagate at the same rate regardless operating conditions of the memory device 100.

As described above, the clock signal may be routed through both the compensated reference delay 210 and the uncompensated delay 212. Next, the clock signals output by the respective delays may be routed into the phase detector 214. The phase detector may compare the phase of the two clock signals received from both the compensated reference delay 210 and the uncompensated delay 212. This comparison may indicate the rate of the signal propagating through the memory device 100 relative to a known constant rate (i.e., signal propagation through the compensated reference delay 210).

If the phase of the clock signal received from the compensated reference delay 210 leads the phase of the uncompensated delay 212, the output of the phase detector may indicate that the memory device 100 is operating in a slow condition. A slow condition may occur, for example, when the memory device 100 is either supplied with a relatively low operating voltage (relative compared to device specifications), is operating at a relatively high temperature (relative compared to device specifications), or the device is supplied with a relatively low voltage and is operating at a relatively high temperature.

Conversely, if the phase of the clock signal received from the compensated reference delay 210 trails the phase of the uncompensated delay 212, the output of the phase detector may indicate that the memory device 100 is operating in a fast condition. A fast condition may occur when the memory device 100 is either supplied with a relatively high operating voltage, is operating at a relatively low temperature, or the device is supplied with a relatively high voltage and is operating at a relatively low temperature.

The output of the phase detector 214 may be connected to a select input of the multiplexer 208. Thus, by operation of the phase detector 214 one of the two inputs of multiplexer 208 is selected. The phase detector 214 may be configured such that if the phase detector 214 determines that the memory device 100 is operating in a fast condition, the phase detector 214 selects the second input of the multiplexer 208, i.e., the input to which the delay device 206 is connected. Thus, if the memory device 100 is operating in a fast condition, the phase detector 214 selects the clock signal which has been delayed by delay device 206. The delayed clock signal selected from the delay device 206 may result in the output timing of the memory device 100 being within specification requirements. For example, if the memory device is operating in the fast condition, signals may propagate through the memory device 100 at a faster rate than normal. Thus, if a delayed clock signal is selected, the net result may be that the memory device operates within timing specifications.

In contrast, if the phase detector 214 determines that the memory device 100 is operating in a slow condition the phase detector may select (via the select input of the multiplexer 208) the first input of the multiplexer 208. Thus, if the memory device 100 is operating in a slow condition, the phase detector 214 selects the clock signal which has been delayed by the clock buffer 204. The selection of the clock signal from the clock buffer 204, instead of the clock signal from the delay device 206 may result in the memory device 100 operating within timing specifications.

After the multiplexer 208 selects the clock signal provided to either the first or second input of the multiplexer 208 without a delay or the clock signal with a delay, the selected clock signal is routed into the data output latch 216. Once the clock signal is received by the data output latch 216, data from the data array present on the input (D) of the data output latch 216 will be latched to the data output (Q) of the memory device 100.

Consequently, embodiments of the invention provide a memory device 100 where variations in the timing of a signal (e.g., a clock signal) as it propagates through the memory device 100 may be detected. Furthermore, corresponding to the behavior of the signal, adjustment of the data output timing may be provided by the memory device 100.

Figure 3A:
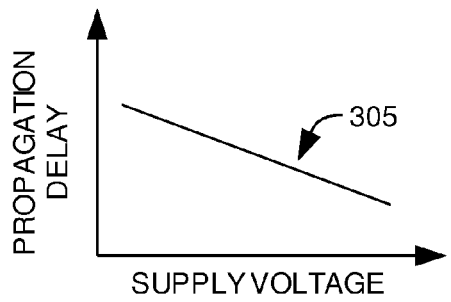
FIGS. 3A-3E are graphs illustrating the relationship between temperature, voltage and propagation delay of signals within a memory device, according to one embodiment of the invention.

FIG. 3A is a graph which illustrates how variations in supply voltage may affect the amount of propagation delay a signal experiences as it travels through an electronic device (e.g., a memory device 100). The graph illustrates propagation delay time along the y-axis and supply voltage along the x-axis. As illustrated by the downward sloping line 305 in FIG. 3A, when supply voltage to an electronic device increases, signal propagation delay decreases. Thus, as a device is supplied with a higher voltage, a signal passing through the device will experience less propagation delay. That is, a signal will travel faster in a device with a higher voltage in contrast to a device with a lower voltage.

Figure 3B:
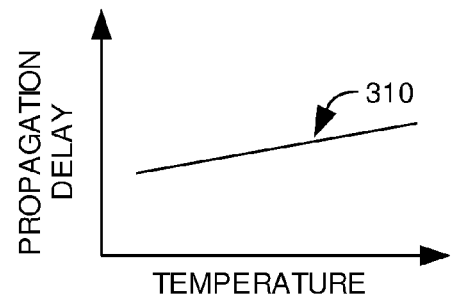

FIG. 3B is a graph which illustrates how variations in temperature affect the amount of propagation delay a signal experiences as it passes through an electronic device (e.g., a memory device 100). The graph illustrates a propagation delay time along the y-axis, and device temperature along the x-axis. As illustrated by the upward sloping line 310 in FIG. 3B, when temperature within an electronic device increases, signal propagation delay increases. Thus, as the temperature of a device increases, a signal passing through the device will experience more delay. That is, a signal will propagate slower through a device operating at a higher temperature than a signal propagating through a device operating at a lower temperature.

As described above, memory device 100 temperatures and voltage levels may vary due to many factors. For example, if the memory device 100 is part of a larger system such as a cell phone or other portable electronic system, the memory device 100 may at times experience a lower voltage due to a declining battery power. In contrast, at other times a memory device may experience a higher voltage, for example, when a battery is fully charged. Similarly, a memory device 100 may experience changes in temperature due to a number of factors. For example, a memory device 100 may be located in a position where it is exposed to a great deal of radiation (e.g., sunlight). This radiation may cause an increase in the temperature of the memory device 100. Furthermore, extended periods of use may also increase the temperature of the memory device 100.

As mentioned previously, one way to compensate for variations in external supply voltage and device temperature is to provide a regulated voltage. The regulated voltage may change or vary the voltage supply to specific components internal to the memory device 100 (e.g., the compensated reference delay 210). The regulated voltage may be determined by monitoring the external supply voltage level and device temperature.

Figure 3C:
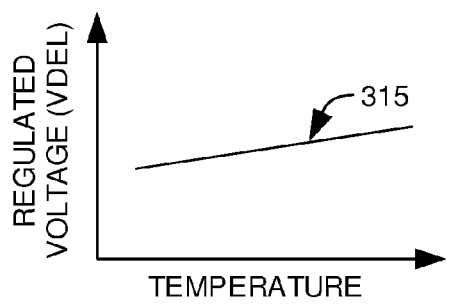

The relationship between the regulated voltage and temperature is illustrated in the graph of FIG. 3C. The graph in FIG. 3C illustrates regulated voltage (VDEL) along the y-axis and device temperature along the x-axis. As illustrated in the graph, the upwardly sloping line 315 shows the relationship between regulated voltage (VDEL) and temperature. As illustrated, when temperature increases the voltage regulator may increase the voltage supplied to a device (VDEL).

Figure 3D:
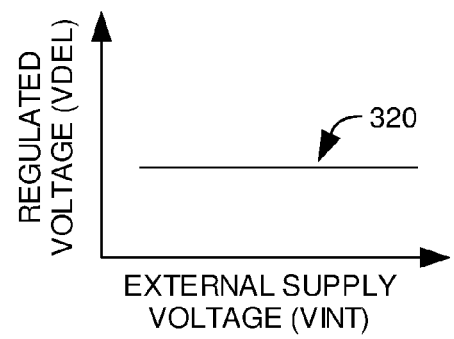

FIG. 3D illustrates how regulated voltage may be kept constant when the external supply voltage changes. As illustrated by the horizontal line 320 in FIG. 3D, as supply voltage increases or decreases, regulated voltage (VDEL) is kept constant by the voltage regulator.

Figure 3E:
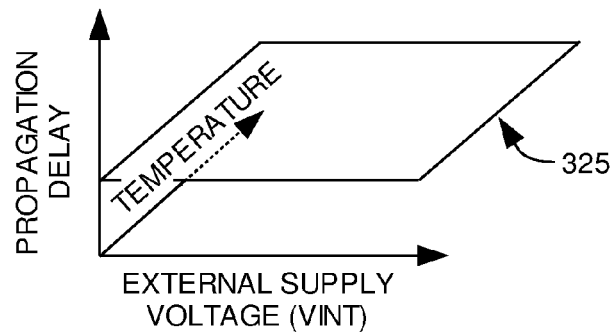

The combined effect of a regulated voltage (VDEL) on propagation delay is illustrated in FIG. 3E. As can be seen the graph in FIG. 3E has three axes. Along a first axis is the external supply voltage (VINT), along a second axis (into the plane of the page) is temperature and along a third (vertical) axis is propagation delay. The amount of propagation delay over the range of temperature and external voltage levels is illustrated in FIG. 3E as a horizontal plane 325. The plane 325 is parallel to both the temperature and the external supply voltage axes. Thus, the propagation delay remains constant over the entire range of temperature and external voltage supply values. Thus, a voltage regulator enables signals traveling through a device to experience the same propagation delay regardless of changes in temperature or external supply voltage.

Figure 4:
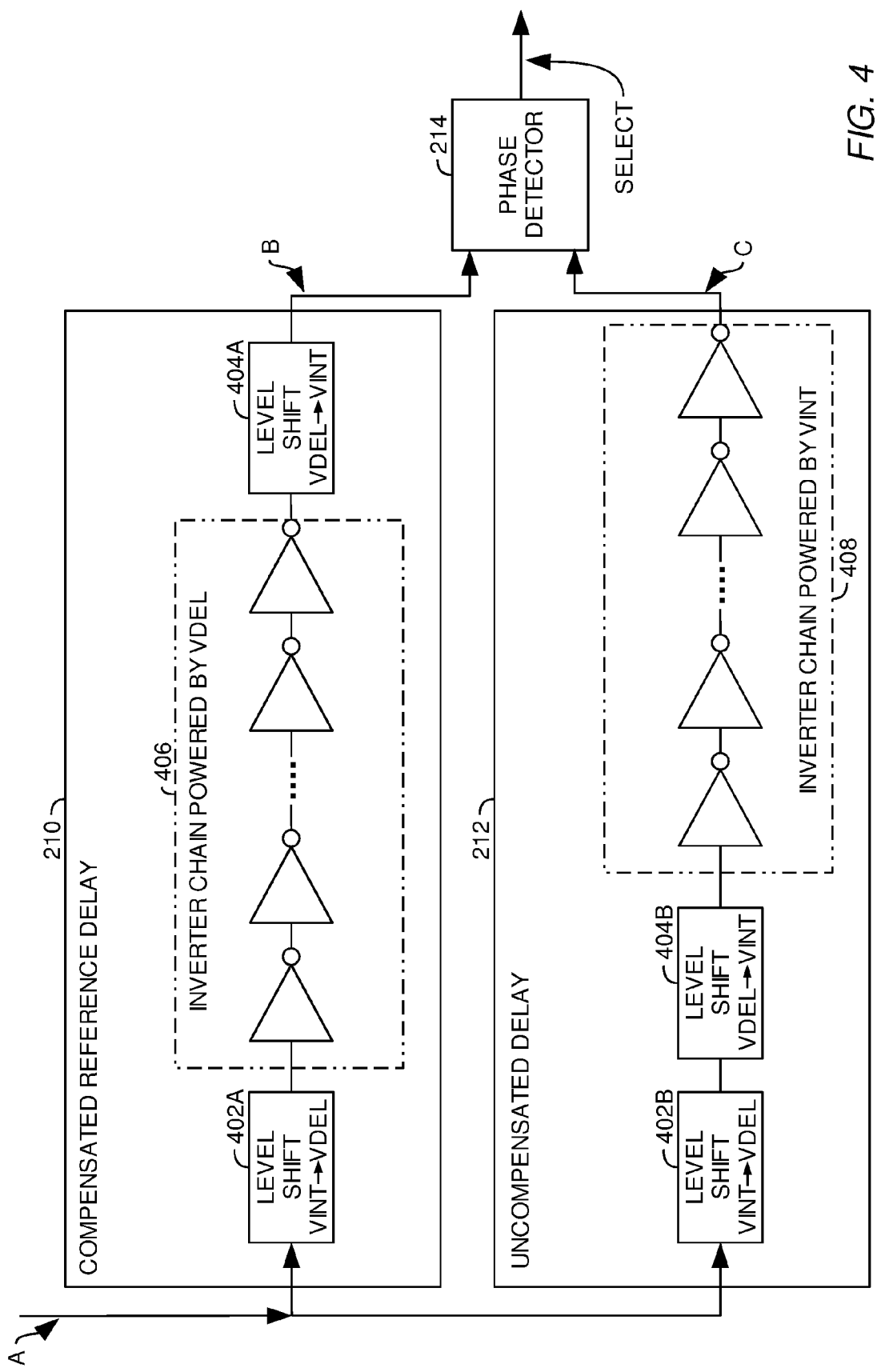
FIGS. 4 and 10 are block diagrams of exemplary circuits for detecting memory circuit timing variations, according to embodiments of the invention.

FIG. 4 illustrates the internal components of the compensated reference delay 210 and the uncompensated delay 212, according to one embodiment of the invention. Signals A, B, and C of FIG. 2 are cross-referenced and FIG. 4. As described previously with regards to FIG. 2, the clock signal from the receiver 202 (illustrated in FIG. 4 as 'A') may be routed into both the compensated reference delay 210, and the uncompensated delay 212. Within the compensated reference delay 210 the signal may initially be routed to a first level shifter 402A where the level of the signal is adjusted from the voltage level of the external voltage supply (VINT) (determined by the external voltage supply) to the regulated voltage level (VDEL) determined by the voltage regulator 110 (FIG. 1). The level shifter 402A may also introduce a delay to the clock signal as it passes through the compensated reference delay 210.

Next, the clock signal may be routed through a compensated inverter chain 406. The compensated inverter chain 406 is said to be compensated, because it is powered by the regulated voltage (VDEL). The number of inverters within the compensated inverter chain 406 may be selected such that a known delay is created. After the signal has passed through the compensated inverter chain 406 the clock signal is routed to second level shifter 404A which shifts the voltage level of the clock signal from the regulated voltage level (VDEL) to the voltage level of the external supply voltage (VINT). The second level shifter 404A may also introduce a delay to the clock signal. After the clock signal passes through the second level shifter 404A, the compensated clock signal (illustrated in FIGS. 2 and 4 as 'B') is routed into a first input of the phase detector 214. Through the use of the level shifters (402A and 406A) and the compensated inverter chain 406, the compensated reference delay 210 may create a known timing delay which will be constant across the entire operating range (temperature and voltage) of the memory device 100.

As mentioned before, the clock signal from the receiver (A) is also routed into the uncompensated delay 212. The clock signal initially passes through a first level shifter 402B and a second level shifter 404B. The first level shifter 402B and the second level shifter 404B cumulatively have no effect on the voltage level of the clock signal as it passes through the uncompensated delay 212. The purpose of having both the first level shifter 402B and the second level shifter 404B, may be to match the delay added to the clock signal as it passed through the level shifters (402A and 404A) in the compensated reference delay 210.

After the clock signal has passed through the level shifters (402B and 404B), the clock signal may be routed through an uncompensated inverter chain 408. The inverter chain 408 is said to be uncompensated because it is powered by the external supply voltage (VINT). Thus, the clock signal in the uncompensated delay 212 may experience a delay indicative of whether the memory device 100 is operating in a slow condition or a fast condition. The number of inverters in the uncompensated inverter chain 408 may be equal to the number of inverters in the compensated inverter chain 406. After the clock signal has passed through the uncompensated inverter chain 408 the signal is routed into a second input of the phase detector 214.

Once both signals (the compensated clock signal 'B' and the uncompensated clock signal 'C') are routed into the phase detector 214, the phase detector 214 may compare the phase of the two signals. As described earlier with reference to FIG. 2, if the phase detector 214 detects a difference between the two signals, the phase detector 214 may select (via the multiplexer) either the clock signal from the clock buffer 204 or the delayed clock signal from the delay device 206 to trigger the data output latch 216.

Thus, the effects of the current operating environment (temperature, supply voltage, etc.) may be determined by comparing the phase of the known delay created by the compensated reference delay 210 with the delay created by the uncompensated delay 212. Knowing the effects of the current operating environment (via the signal received from the uncompensated delay 212), may enable the phase detector to determine whether the memory device 100 is operating in a fast condition or a slow condition. If the memory device 100 is operating in a fast condition a delay may be imposed on the clock signal (by selecting the clock signal routed through the delay device 206) such that the memory device 100 operates within the specification parameters as required by the device.

Figure 5:
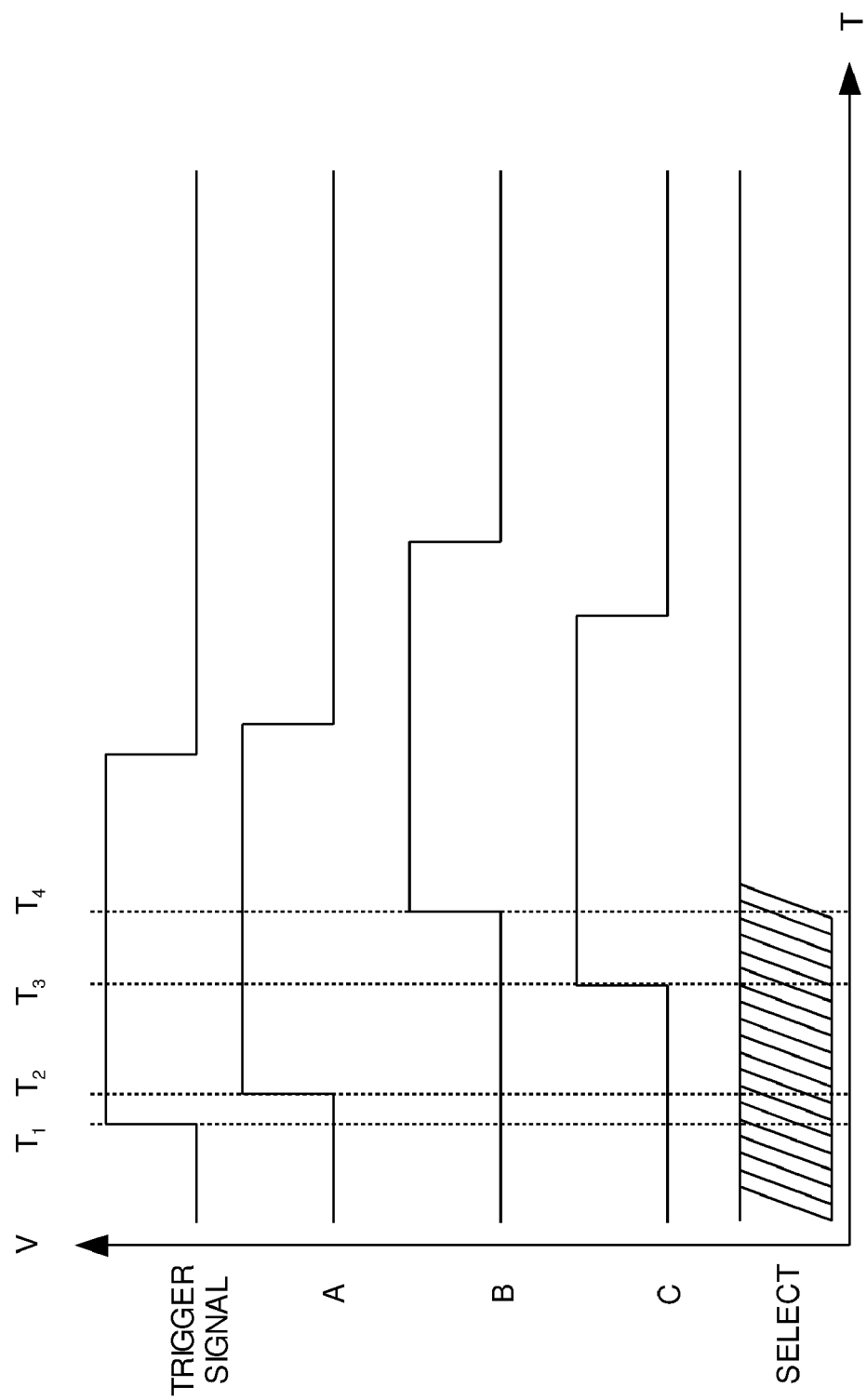
FIGS. 5 and 6 are timing diagrams illustrating signal timing throughout a memory device, according to one embodiment of the invention.

FIG. 5 is a timing diagram illustrating the timing of signals at different locations within the memory circuit 100 when a memory device is operating in a fast condition. A memory device may be operating in a fast condition, for example, when the memory device is operating at a relatively low temperature and/or is being supplied with relatively high voltage. FIG. 5 illustrates the timing of signals in relative proximity to the compensated reference delay 210 and the uncompensated delay 212. Accordingly, reference will also be made to FIG. 2. A trigger signal is shown occurring at a first point in time $T_1$. The trigger signal may be any signal propagating into or through the memory device 100. In the case of FIG. 5, the trigger signal is a clock signal received from a device connected to the memory device 100. According to different embodiments of the invention, and described further below with reference to FIGS. 6 and 7, the trigger signal may be generated by signals other than the clock signal.

As illustrated in FIG. 5 the trigger signal (i.e., the clock signal) may originally occur at $T_1$ when the clock signal is received by the memory device 100. Later, at time $T_2$, the rising edge of the clock signal occurs at a point A in the memory circuit. Referring back to FIG. 2 and FIG. 4, point A is located immediately before the compensated reference delay 210 and the uncompensated delay 212. At time $T_3$, the rising edge of the clock signal exits the uncompensated delay 212 at point C. As also can be seen in FIG. 5, the rising edge of the clock exits the compensated reference delay 210 at point B at time $T_4$. The arrival of the clock signal from the uncompensated delay 212 before the arrival of the clock signal from the compensated reference delay 210 indicates that the memory device 100 is operating in a fast condition. That is, the clock signal is experiencing less delay than a clock signal would experience in normal conditions.

In the fast condition, according to one embodiment of the invention, the phase detector 214 will assert the select signal, as illustrated in FIG. 5. Asserting the select signal may cause the multiplexer 208 to select the multiplexer input connected to the delay device 206 causing the multiplexer 208 to output the delayed clock signal. The addition of the delay to the clock signal may allow the memory device 100 to output data within the time frame specified by the device specifications.

Figure 6:
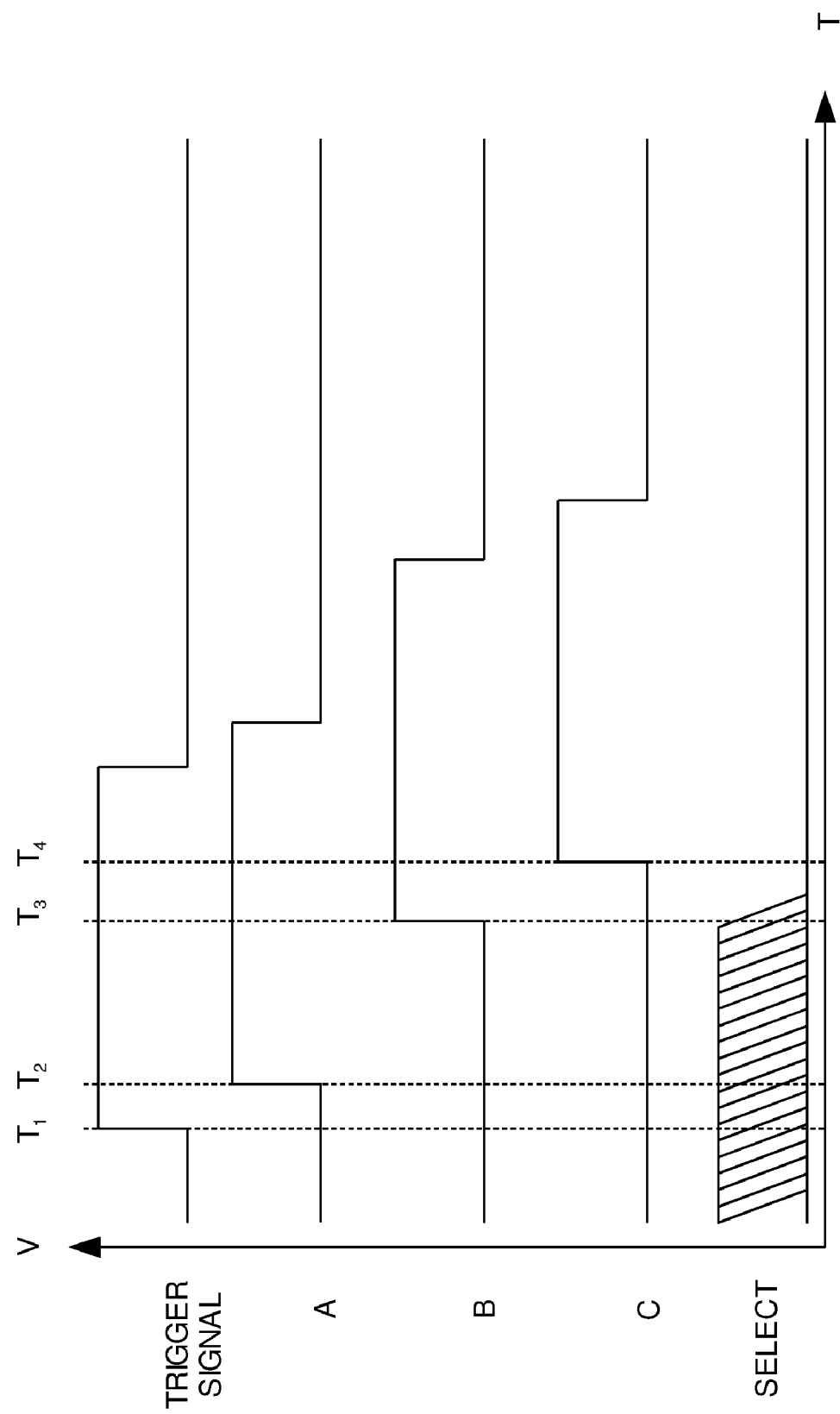

In contrast, FIG. 6 is a timing diagram illustrating the timing of signals at different locations within the memory circuit 100 when the memory device 100 is operating in a slow condition, according to one embodiment of the invention. The memory device 100 may be operating in a slow condition, for example, when the memory device 100 is operating at a high temperature and/or is being supplied with low voltage. FIG. 6 illustrates the timing of signals in relative proximity to the compensated reference delay 210 and the uncompensated delay 212. Accordingly, reference will also be made to FIG. 2. A trigger signal is shown occurring at a first point in time $T_1$. As illustrated in FIG. 1 the clock signal may originally occur at $T_1$ when the clock signal is received by the memory device 100. According to different embodiments of the invention, and described further below with reference to FIGS. 7 and 8, the trigger signal may be generated by other signals occurring within the memory device 100.

Later, at time $T_2$, the rising edge of the clock signal occurs at a point A in the data output circuitry 106, located immediately before the compensated reference delay 210 and the uncompensated delay 212. As can be seen in FIG. 6, the rising edge of the clock signal exits the compensated reference delay 210 at point B at time $T_3$. At time $T_4$, the rising edge of the clock exits the uncompensated delay 212 at point C. The arrival of the clock signal from compensated reference delay 210 before the arrival of the clock signal from the uncompensated delay 212 indicates that the memory device 100 is operating in a slow condition. That is, the clock signal is experiencing more delay than a clock signal would experience in normal conditions.

In the slow condition, according to one embodiment of the invention, the phase detector 214 may drive the select signal low, as illustrated in FIG. 6, such that in response to the low signal present at the select input of the multiplexer 208, the multiplexer 208 may select the clock signal without a delay imposed by the delay element 206 (i.e., the signal output by the clock signal buffer 204). The selection of the clock signal without the imposed delay may allow the memory device 100 to achieve data output within the output timing specifications of the memory device 100.

Figure 7:
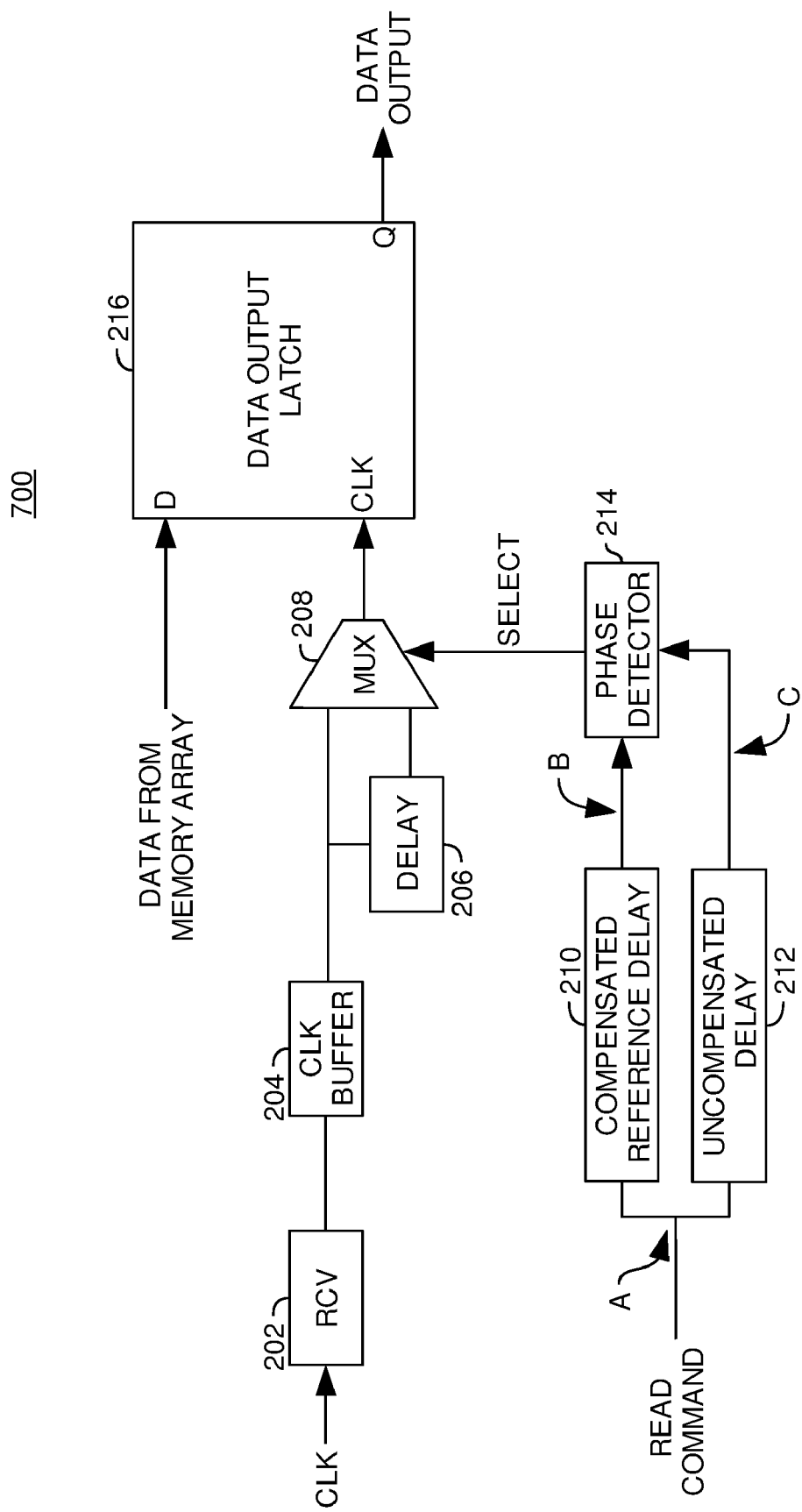

FIG. 7 is a block diagram of a circuit 700 (which may be included with the data output circuitry 106) for adjusting the output timing of the memory device 100, according to another embodiment of the invention. FIG. 7 shares many of the same components as illustrated and described with reference to FIG. 2, and like components are identified by like reference numbers. However, the input to the compensated reference delay 210 and the uncompensated delay 212 (i.e., the trigger signal) does not come from the clock signal. In contrast, the input for the compensated reference delay 210 and the uncompensated delay 212 may originate from a read command. For example, when a read command is received by the memory device 100, a signal may be generated which may be routed into the compensated reference delay 210 and the uncompensated delay 212 simultaneously. Based on the timing of the propagation of the read command signal through the compensated reference delay 210 and the uncompensated delay 212 circuits, the phase detector 214 may determine whether to assert or de-assert the signal to the select input of the multiplexer 208. Consequently, the multiplexer 208 may select the clock signal from the clock buffer 204, or the clock signal from the delay device 206. The phase detector 214 may maintain (e.g., latch) the selection signal, for example, until a subsequent read command is received.

The use of a read command to test for propagation delay, and consequently to select the input of the multiplexer, may reduce overall power usage in the memory device 700. This may be due to the fact that the data output circuitry 106 may not be used until a data read command is received. As depicted, the circuit illustrated in FIG. 2 routes the clock signal through the compensated reference delay 210, the uncompensated delay 212, and the phase detector 214 whenever a clock signal is received. Therefore, the clock signal may use energy as it propagates through the compensated reference delay 210, the uncompensated delay 212, and the phase detector anytime the clock signal is received by the memory device 100. In contrast, the circuit 700 illustrated in FIG. 7 may only propagate a signal through the compensated reference delay 210 and the uncompensated delay 212 when a command is received that will output data (i.e., a read command). According to other embodiments of the invention, other signals related to outputting data (i.e., related to read commands) may be used to propagate through the compensated reference delay 210 and the uncompensated delay 212.

Figure 8:
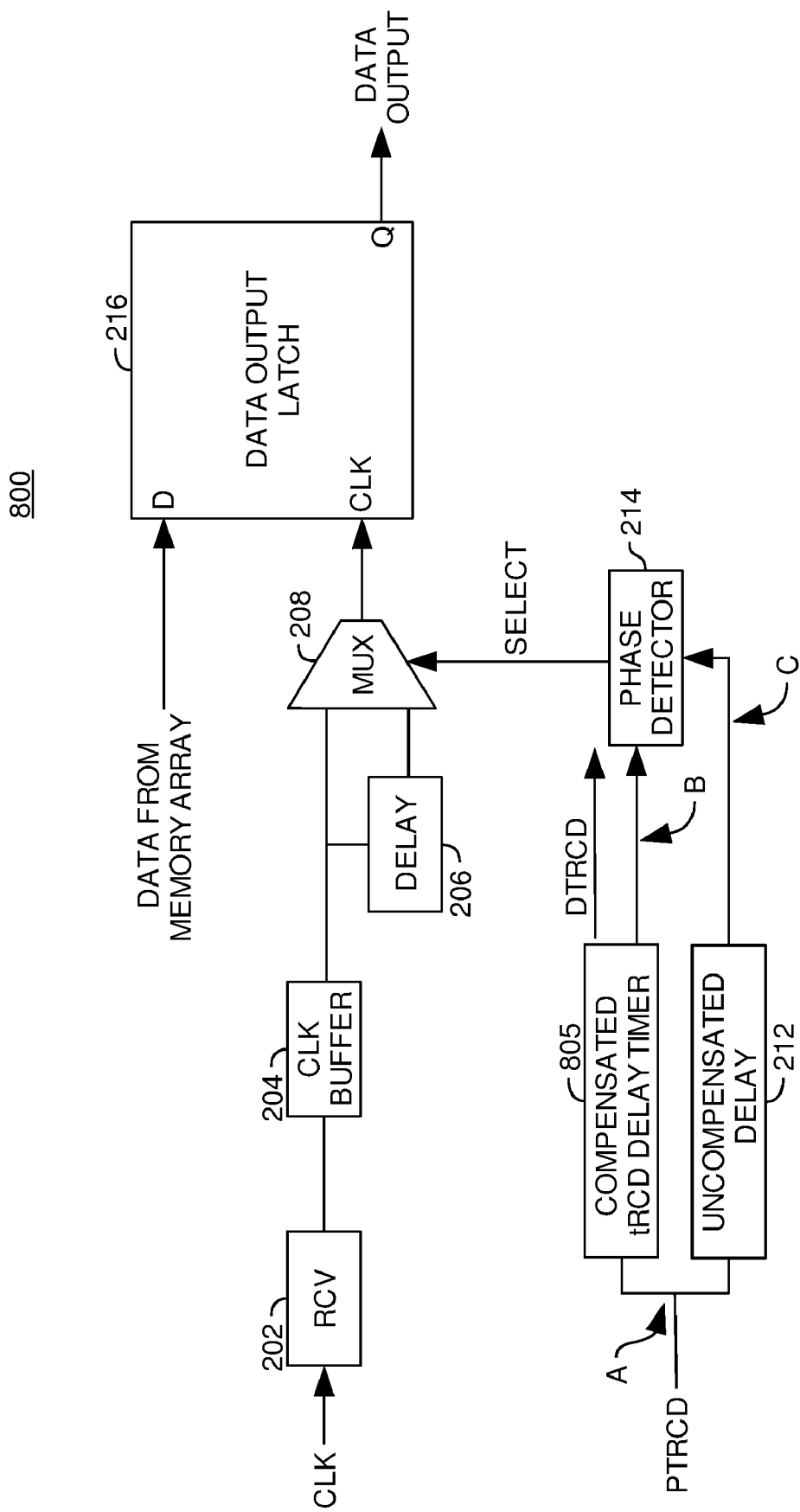

FIG. 8 is a block diagram of a circuit 800 (which may be included with the data output circuitry 106) for adjusting the output timing of the memory device 100, according to another embodiment of the invention. FIG. 8 shares many of the same components as illustrated and described with reference to FIG. 2, and like components are identified by like reference numbers. However, the embodiment illustrated in FIG. 8 may operate in an asynchronous or mixed mode memory device 100. Furthermore, in contrast to FIG. 2, the embodiment illustrated in FIG. 8 may utilize preexisting compensated delay circuitry present within the memory device 100 to serve as the compensated reference delay 210.

For example, the compensated delay circuitry used as the reference delay in FIG. 8 may be a RAS (row address strobe) to CAS (column address strobe) Delay timer 805 (RCD timer). The primary use of the RCD timer 805 is to provide a delay between the row activation command (RAS command) and the read/write command (CAS command). Furthermore, in the present embodiment, the input to the RCD timer 805 (i.e., the trigger signal) is not the clock signal. Instead, the input signal (PTRCD) to the RCD timer 805 is generated in response to an internal row activation command (e.g., when the external RAS command is received and decoded by the memory device 100, control circuitry within the memory device 100 generates a corresponding internal row activation command which causes PTRCD to be asserted). When the PTRCD signal is asserted, the RCD timer 805 is initiated to provide a delay between row activation and the read/write command as described above. After the RCD timer 805 reaches the prescribed delay time, the RCD timer 805 asserts a delay signal DTRCD, thereby indicating that processing of the read/write command (CAS command) may proceed. The DTRCD signal is then used by the command decoder to initiate processing of the read/write command (CAS command).

By using a pre-existing reference delay circuit (e.g., the RCD timer 805 circuit), a reference delay circuit solely for the purpose of data output timing adjustment is not necessary. Therefore, the use of the RCD timer 805 may reduce the area on the memory device 100 necessary to create the data output circuit 106 and consequently the area on the memory device necessary to adequately adjust data output timing.

Furthermore, the PTRCD signal is generated only when data output is necessary, which, coincidentally, is when adjustment of the data output timing may be necessary. Therefore, the use of the PTRCD signal may reduce the power used by the circuit by testing the memory device 100 for timing variations and adjusting data output timing only when necessary.

Figure 9:
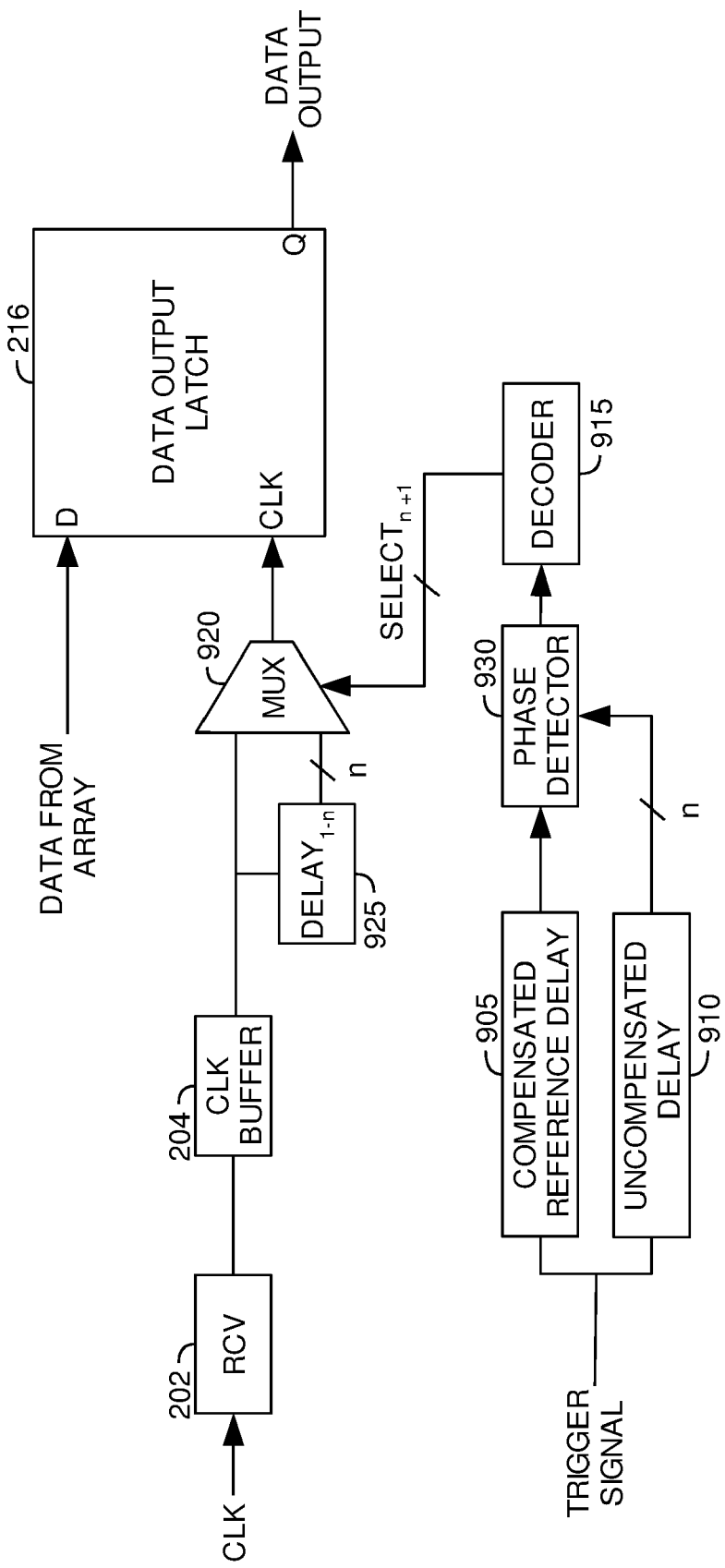

FIG. 9 illustrates is a block diagram of a circuit 900 (which may be part of the data output circuitry 106) for adjusting the output timing of the memory device 100, according to another embodiment of the invention. FIG. 9 shares many of the same components as illustrated and described with reference to FIG. 2. However, the embodiment presented in FIG. 9 has a delay device 925 which may contain a number (n) of delay elements. The delay elements in the delay device 925 may be arranged in series with a connection after each delay element being connected to a different input of a multiplexer 920. This configuration may provide a plurality of clock signals with different amounts of delay routed into the multiplexer 920. The multiplexer 920 may be configured such that, via a select signal or signals from a decoder device 915, either the clock signal from the clock buffer 204 or one of the plurality of delayed clock signals from the delay device 925 may be selected by the decoder device 915 and thereby routed to the input of the data output latch 216.

In order to determine which of the plurality of inputs on the multiplexer may be selected, a compensated reference delay 905, an uncompensated delay 910 a phase detector 930, and the decoder device 915 may be provided. Furthermore, a trigger signal may be routed into the compensated reference delay 905 and the uncompensated delay 910. The trigger signal may be any signal related to the output of data from the memory device 100 (e.g., a read command signal, a clock signal, etc.).

Figure 10:
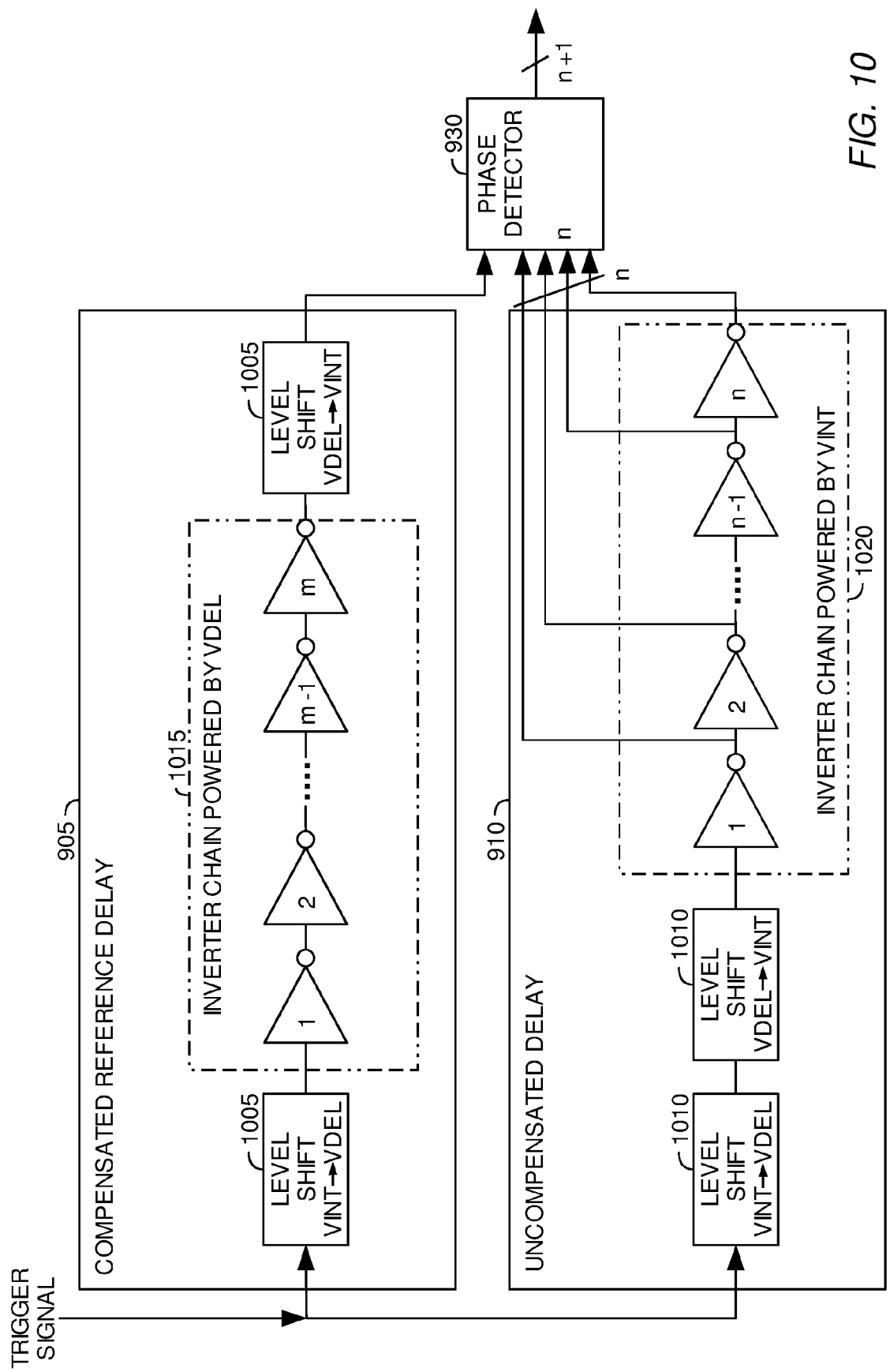

FIG. 10 illustrates an exemplary block diagram of the compensated reference delay 905 and the uncompensated delay 910 used in FIG. 9, according to one embodiment of the invention. The compensated reference delay 905 may contain level shifters 1005 in order to adjust the voltage level of the trigger signal to a regulated voltage level (VDEL). Furthermore, the compensated reference delay 905 may also contain a series of inverters powered by the regulated voltage 1015. The combination of the level shifters 1005 and the series of inverters 1015 may provide a known or reference time period in order to determine the current propagation delay of the memory device 100.

The uncompensated delay 910 also contains two level shifters 1010 in order to match the delay added to the compensated reference delay 905 by the two level shifters 1005 in the compensated reference delay. The uncompensated delay 905 also contains a delay chain 1020; however, the delay chain 1020 in the uncompensated delay 905 may be powered by the external voltage supply (VINT) and therefore is susceptible to propagation delay due to a number of factors (e.g., process variations, power supply variations, temperature variations, etc.). As the trigger signal passes through the inverter chain 1020 powered by the external supply voltage (VINT), the signal is tapped off after each delay element and routed into the phase detector 930.

The output of the compensated reference delay 905 may be coupled to the input of a decoder device 915. A plurality of outputs (e.g., n outputs) from the uncompensated delay 910 may also be connected to the phase detector 930. The phase detector 930 may compare the phase of the trigger signal received from the compensated reference delay 905 with the phase of the plurality of signals received from the uncompensated delay 910. Based on the comparison, the phase detector may determine how much faster or slower signals are propagating through the memory device 100 due to current operating conditions.

Based on the phase comparison the phase detector 930 sends a signal to the decoder device 915. Based on the signal from the phase detector 930 the decoder device 915 may determine if the clock signal needs to be delayed and, if so, how much delay the clock signal may need to be within the specifications for the memory device 100. The decoder device 915 may have a single select output or a plurality of select outputs. The select output or outputs may be coupled to the select inputs of the multiplexer 920. After determining whether to add delay to the clock signal, and if so how much, the decoder device 915 may send a signal(s) via the select output(s) to the multiplexer 920. The select signal from the decoder device 915 may trigger the multiplexer 920 to select from the inputs of the multiplexer 920 either the clock signal from the clock buffer 204 or one of the plurality of delayed clock signals from the delay device 925.

For example, if the memory device 100 is operating in a fast condition (e.g., high voltage, low temperature, or both), the decoder device 915 may select a delayed signal from the delay device 925 which contains an appropriate amount of delay imposed on the clock signal such that the data will be latched to the data output (Q) within the timing output requirements of the memory device 100. Conversely, if the memory device is operating in a slower condition, the decoder device 915 may select a delayed signal from the delay device 925 which contains less delay imposed on the clock signal. Furthermore, if the memory device is operating in a slowest condition, the decoder device 915 may select the clock signal directly from the clock buffer 204 without any delay imposed. Therefore, the decoder device 915 may select the appropriate clock signal from either the delay device 925 or the clock buffer 204, corresponding to condition in which the memory device 100 is operating, Thus, circuits are provided which may detect signal propagation rates through an electronic device. Based on the detected propagation rate, the circuit may adjust (or not) the data output timing of the device such that the data output timing is within specification parameters.

Although JEDEC (Joint Electron Device Engineering Council) standard terms are used within the text and Figures of the present application (e.g., PTRCD), they are used merely for convenience and are not meant to limit the scope or breadth of embodiments of the invention. Furthermore, standard or non-standard embodiments are contemplated.

While the foregoing is directed to embodiments of the present invention, other and further embodiments of the invention may be devised without departing from the basic scope thereof, and the scope thereof is determined by the claims that follow.

What is claimed is:

1. A method for adjusting a data output timing of an electronic device, comprising:
    receiving a trigger signal;
    based on the trigger signal, determining whether the electronic device is operating in one of a first mode and a second mode, the first and second modes being differentiated by a rate at which the trigger signal propagates relative to a predetermined standard;
    if the electronic device is operating in the first mode, triggering an output of data with a first clock signal; and
    if the memory device is operating in the second mode triggering the output of the data with a second clock signal, wherein the second clock signal is delayed relative to the first clock signal.

2. The method of claim 1, wherein determining if the electronic device is operating in one of the first mode and second mode comprises:
    routing the trigger signal through a compensated reference delay to generate a first signal;
    routing the trigger signal through an uncompensated delay to generate a second signal; and
    comparing a phase of the first signal to a phase of the second signal, wherein if the phase of the first signal is ahead of the phase of the second signal, the memory device is operating in the second mode, and if the phase of the first signal is behind the phase of the second signal, the memory device is operating in the first mode.

3. The method of claim 2, wherein
routing the trigger signal through the compensated reference delay to generate the first signal comprises:
    adjusting a voltage of the trigger signal from a supply voltage to a regulated voltage;
    routing the trigger signal through a delay chain powered by the regulated voltage; and
    adjusting the voltage of the trigger signal from the regulated voltage to the supply voltage.

4. The method of claim 2, wherein
routing the trigger signal through an uncompensated delay to generate a second signal comprises:
    adjusting a voltage of the trigger signal from a supply voltage to a regulated voltage;
    adjusting the voltage of the trigger signal from the regulated voltage to the supply voltage; and
    routing the trigger signal through a delay chain powered by the supply voltage.

5. The method of claim 1, wherein the trigger signal is one of:
    a clock signal;
    generated within the memory device in response to a read command; and
    based off an internal row activation command.

6. The method of claim 1, wherein the output of the compensated reference delay is used as an internally compensated RAS to CAS delay (tRCD).

7. An apparatus for adjusting the data output timing of an electronic device, comprising:
    a memory array; and
    data output circuitry, wherein the data output circuitry is configured to perform the steps comprising:
        receiving a trigger signal;
        based on the trigger signal, determining whether the electronic device is operating in one of a first mode and a second mode, the first and second modes being differentiated by a rate at which the trigger signal propagates relative to a predetermined standard;
        if the electronic device is operating in the first mode, triggering an output of data with a first clock signal; and
        if the memory device is operating in the second mode triggering the output of the data with a second clock signal, wherein the second clock signal is delayed relative to the first clock signal.

8. The apparatus of claim 7, further comprising:
    a compensated reference delay; and
    a uncompensated reference delay; and
    wherein the data output circuitry is configured to determine whether the electronic device is operating in one of the first mode and the second mode by performing further steps comprising:
    routing the trigger signal through the compensated reference delay to generate a first signal;
    routing the trigger signal through the uncompensated delay to generate a second signal; and
    comparing a phase of the first signal to a phase of the second signal, wherein if the phase of the first signal is ahead of the phase of the second signal, the memory device is operating in the second mode, and if the phase of the first signal is behind the phase of the second signal, the memory device is operating in the first mode.

9. The apparatus of claim 8, further comprising:
    a voltage regulator configured to provide a regulated voltage; and
    wherein routing the trigger signal through the compensated reference delay to generate the first signal comprises:

adjusting a voltage of the trigger signal from a supply voltage to the regulated voltage;

routing the trigger signal through a delay chain powered by the regulated voltage; and adjusting the voltage of the trigger signal from the regulated voltage to the supply voltage.

10. The apparatus of claim 9, wherein routing the trigger signal through an uncompensated delay to generate a second signal comprises:

adjusting a voltage of the trigger signal from a supply voltage to the regulated voltage;

adjusting the voltage of the trigger signal from the regulated voltage to the supply voltage; and routing the trigger signal through a delay chain powered by the supply voltage.

11. The apparatus of claim 7, wherein the trigger signal is one of:

a clock signal;

generated within the memory device in response to a read command; and based off an internal row activation command.

12. A memory device, comprising:

a clock signal input configured to receive a clock signal, and coupled to a first data input of a selection circuit and to an input of a delay device;

an output of the delay device coupled to a second data input of the selection circuit;

a compensated reference delay circuit configured to receive a trigger signal, and having at least one delay component being powered by a regulated voltage;

an uncompensated delay circuit configured to receive the trigger signal, and having at least one delay component being powered by an unregulated voltage;

an output of the compensated reference delay circuit being coupled to a first input of a phase detector circuit, an output of the uncompensated delay circuit being coupled to a second input of a phase detector circuit, wherein the phase detector circuit is configured to compare the phase of signals received from the compensated reference delay circuit and the uncompensated delay circuit, and in response to the comparison send a select signal to the selection circuit; and an output of the selection circuit coupled to an input of a data output latch, wherein in response to the select signal the selection circuit is configured to couple at least one of the first input of the selection circuit to the input of the data latch and the second input of the selection circuit to the input of the data latch.

13. The memory device of claim 12, wherein the clock signal input is coupled to the trigger signal input.

14. The memory device of claim 12, wherein the trigger signal input is coupled to a signal output which generates a signal related to a read command.

15. The memory device of claim 12, wherein the compensated reference delay circuit is a row access select to column access select delay timer.

16. The memory device of claim 12, wherein the compensated reference delay circuit is a row access select to column access select delay timer.

17. The memory device of claim 12, wherein the compensated reference delay circuit comprises:

an input of a first voltage shifter coupled to the trigger signal input, wherein the first voltage shifter is configured to shift a voltage level of the trigger signal from a supply voltage to the regulated voltage;

an output of the first voltage shifter coupled an input of the at least one delay component which is powered by the regulated voltage, the at least one delay component being a compensated delay chain circuit;

an output of the delay chain circuit coupled to an input of a second voltage shifter, wherein the second voltage shifter is configured to shift the voltage level of the trigger signal from the regulated voltage to the supply voltage; and an output of the second voltage shifter coupled to the first input of the phase detector circuit.

18. The memory device of claim 17, wherein at the regulated voltage the trigger signal will propagate through the compensated reference delay at a known rate.

19. The memory device of claim 17, wherein the compensated reference delay chain circuit comprises a series of inverters powered by the regulated voltage.

20. The memory device of claim 12, wherein the uncompensated delay comprises:

an input of a first voltage shifter coupled to the trigger signal input, wherein the first voltage shifter is configured to shift the voltage level of the trigger signal from the unregulated voltage to the regulated voltage;

an output of the first voltage shifter coupled an input of a second voltage shifter, wherein the second voltage shifter is configured to shift the voltage level of the trigger signal from the regulated voltage to the unregulated voltage;

an output of the second voltage shifter coupled to an input of an uncompensated delay chain circuit which is powered by the unregulated voltage; and an output of the uncompensated delay chain circuit coupled to the second input of the phase detector circuit.

21. The memory device of claim 18, wherein the uncompensated delay chain circuit comprises a series of inverters powered by the unregulated voltage.

22. A method for adjusting the data output timing of a memory device, comprising:

generating a plurality of delayed clock signals using a clock signal;

routing a trigger signal through a compensated delay chain to generate a compensated delayed trigger signal;

routing the trigger signal through an uncompensated delay chain to generate a plurality of uncompensated delayed trigger signals;

comparing a phase of the compensated delayed trigger signal with phases of the plurality of uncompensated delayed trigger signals; and based on the comparison of the phases, selecting at least one of the clock signal or the plurality of delayed clock signals to trigger a data output latch.

23. The method of claim 22, wherein compensated delay chain is powered by a regulated voltage, and wherein the uncompensated delayed chain is powered by an unregulated voltage.

24. The method of claim 22, wherein generating the plurality of delayed clock signals comprises:

routing the clock signal through a series of inverters, and after each inverter in the series of inverters; tapping off a delayed clock signal.

25. An apparatus for adjusting the data output timing of a memory device, comprising:

a memory array; and data output circuitry configured to perform steps comprising:

receiving a clock signal and a trigger signal;
generating a plurality of delayed clock signals using the clock signal;
routing the trigger signal through a compensated delay chain to generate a compensated delayed trigger signal;
routing the trigger signal through an uncompensated delay chain to generate a plurality of uncompensated delayed trigger signals;
comparing a phase of the compensated delayed trigger signal with phases of the plurality of uncompensated delayed trigger signals; and
based on the comparison of the phases, selecting at least one of the clock signal or the plurality of delayed clock signals to trigger a data output latch coupled to the memory array.

* * * * *